US00RE34982E

United States Patent [19]

Prabhu et al.

[11] E Patent Number: Re. 34,982

[45] Reissued Date of Patent: Jun. 27, 1995

[54] THICK FILM COPPER VIA FILL INKS

[75] Inventors: Ashok N. Prabhu, East Windsor, N.J.; Kenneth W. Hang, Westchester, Pa.

[73] Assignee: David Sarnoff Research Center, Inc., Princeton, N.J.

[21] Appl. No.: 179,480

[22] Filed: Jan. 4, 1994

Related U.S. Patent Documents

Reissue of:

[64] Patent No.: 5,082,804
Issued: Jan. 21, 1992
Appl. No.: 450,937
Filed: Dec. 15, 1989

U.S. Applications:

[63] Continuation-in-part of Ser. No. 299,112, Jan. 19, 1989, abandoned.

[51] Int. Cl.[6] ..... C03C 8/18

[52] U.S. Cl. ..... 501/19; 501/20; 501/26; 501/69; 428/209; 428/210; 428/426; 428/432; 428/689; 428/901

[58] Field of Search ..... 501/19, 20, 26, 69; 428/411.1, 426, 432, 433, 209, 210, 689, 901

[56] References Cited

U.S. PATENT DOCUMENTS

| | | | |
|---|---|---|---|
| 3,498,876 | 3/1970 | Baak et al. | 501/69 |
| 4,191,789 | 3/1980 | Brown et al. | 427/97 |
| 4,301,324 | 11/1981 | Kumar et al. | 174/68.5 |
| 4,313,026 | 1/1982 | Yamada et al. | 174/68.5 |
| 4,714,687 | 12/1987 | Holleran et al. | 501/9 |
| 4,808,770 | 2/1989 | Prabhu et al. | 501/69 |
| 4,810,420 | 3/1989 | Prabhu et al | 501/69 |
| 4,816,615 | 3/1989 | Prabhu et al. | 501/69 |
| 4,830,988 | 5/1989 | Hang et al. | 501/77 |

FOREIGN PATENT DOCUMENTS

| | | | |
|---|---|---|---|
| 0262975 | 4/1988 | European Pat. Off. | H05K 3/12 |
| 1108473 | 4/1988 | United Kingdom | C03C 3/22 |

*Primary Examiner*—David Brunsman
*Attorney, Agent, or Firm*—W. J. Burke

[57] ABSTRACT

Low-expansion devitrifying glass compositions exhibiting a negative-slope temperature coefficient of expansion over a temperature range from about 125° C. to about 500° C. are useful for the fabrication of thick film copper via-fill inks of multilayer printed-circuit boards.

14 Claims, No Drawings

THICK FILM COPPER VIA FILL INKS

Matter enclosed in heavy brackets [ ] appears in the original patent but forms no part of this reissue specification; matter printed in italics indicates the additions made by reissue.

This application is a *reissue of U.S. Pat. No. 5,082,804 which is a* continuation-in-part of application Ser. No. 07/299,112 filed Jan. 19, 1989 [pending] *now abandoned. ep*

BACKGROUND OF THE INVENTION

The present invention relates to devitrifying-glass formulations and, more particularly, to improved thick film copper via fill inks comprised of devitrifying-glass compositions for use on multilayer alumina-substrate circuit boards.

Thick film copper conductor printing inks comprised of devitrifying glass for use in the fabrication of printed circuit boards are known in the art. The fabricated circuit board is comprised of a dielectric substrate on which is printed one or more conductive metal (e.g., copper) circuits. The use of a devitrifying glass in the thick film copper ink formulation is desirable because its high softening temperature, i.e. about 900° C. or higher, withstands repeated firings at lower temperatures and the conducting metal patterns do not become distorted or diffuse into adjacent layers. Multilayer circuit boards have alternating dielectric/conductor layers.

As is known, a thick film copper ink is comprised of copper powder, a devitrifying glass and a suitable organic medimm.

In the case of multilayer circuit boards, it is necessary to provide via holes filled with copper to electrically interconnect the respective layers to one another. Copper exhibits a relatively high temperature coefficient of linear expansion (i.e., $170–190\times10^{-7}$/° C.). However, dielectric material, which is normally employed as a substrate of a printed circuit board, exhibits a much lower temperature coefficient of linear expansion than does copper. For instance, in the case of alumina, which is widely used as a printed-circuit substrate material, the temperature coefficient of linear expansion is about $63\times10^{-7}$/° C. at room temperature and rises to about $8\times10^{-7}$/° C. at 900° C.

Devitrifying glass, as known in the art, exhibits a relatively low positive temperature coefficient of linear expansion, which is substantially below that of alumina. Specifically, devitrifying glass compositions known in the art exhibit a temperature coefficient of linear expansion in a range of the mid-twenties to the mid-thirties $\times10^{-7}$/° C. at room temperature, which then rises to about $40\times10^{-7}$/° C. at 900° C.

Because the thick-film copper inks known in the past included both devitrifying glass and copper, the printed conductors of the fabricated circuit board exhibited a temperature coefficient of linear expansion significantly below that of copper alone, but still significantly higher than that of an alumina substrate. The difference between the respective temperature coefficients of linear expansion of the alumina substrate and the printed conductor, fabricated from a thick-film printing ink comprises of a prior-art devitrifying glass composition, is most pronounced at higher temperatures of the printed circuit board (i.e., in the range of 600°–900° C.).

In the case of thick-film copper ink via fills for multilayer alumina-substrate circuit boards, the difference in the respective temperature coefficients of linear expansion of the substrate material and the copper (particularly at high temperatures) creates a problem. One adverse effect is the tendency of the copper via fill film made from the ink to blister during fabrication of the multilayer printed circuit board when the temperature is raised to about 900° C. Second, because the mismatch between the two materials, the greater positive temperature coefficient of linear expansion of the copper ink via fill with respect to that of the multilayer alumina substrate tends to cause cracking of the multilayer alumina substrate during fabrication, or thereafter during use, of the multilayer printed-circuit board. This cracking is due to pressure of the copper ink via fill against the walls of the via hole in the alumina substrate.

Even if one could formulate a thick-film copper via fill ink that had a thermal coefficient of linear expansion that closely matched that of alumina at the upper portion of the temperature range between room temperature to 900° C., thereby avoiding the problems of blistering and cracking, a new problem would result at lower temperatures (e.g., room temperature). The new problem is that at such low temperatures, the copper via fill ink then would tend to shrink in the via hole in the alumina substrate, thereby tending to break away from the substrate and fall out of the multilayer printed-circuit board.

What is desired is a thick-film copper ink via fill that has a thermal coefficient of linear expansion that closely matches that of an alumina substrate over the entire temperature range of room temperature to 900° C. The present invention is directed to improved devitrifying glass compositions suitable for use in thick film copper via fill inks, which exhibit a temperature coefficient of expansion that closely matches that of alumina over the entire range of temperatures from room temperature to 900° C.

SUMMARY OF THE INVENTION

The improved devitrifying-glass compositions of the present invention comprise a mixture of zinc oxide (ZnO), alumina ($Al_2O_3$) and silicon dioxide ($SiO_2$) in certain proportions by weight. These devitrifying-glass compositions are distinguished from other low temperature coefficient of expansion (i.e., less than $30\times10^{-7}$/° C.) devitrifying glasses of the prior art by exhibiting a negative slope of temperature coefficient of linear expansion over a temperature range that extends from about 125° C. to about 500° C.

Further, the present invention is directed to a thick film copper ink suitable for use in filling vias of a multilayer printed circuit on an alumina substrate. The ink comprise a mixture of copper powder and the devitrifying glass of the present invention in an organic vehicle, in which the weight ratio of copper to devitrifying glass is in the range of from about 10:3 to about 10:6.

PREFERRED EMBODIMENTS OF THE PRESENT INVENTION

The present invention is directed to compositions of zinc-alumin-silicate devitrifying glass frits comprised, on a weight basis, of about 43 to 48% of the zinc oxide (ZnO), about 10 13% of aluminum oxide (Al, and about 40 to 46% of silicon dioxide ($SiO_2$).

The glasses of the invention are made by mixing the dry powdered oxides, melting them in an inert container and quenching. The glass is then ground to a particle size of about 3 to 8 micrometers by dry grinding followed by wet grinding as is known in the art.

Copper via fill inks can be prepared from the above glasses by mixing with copper powder having a particle size of about 1 to 5 micrometers, commercially available from Grezes Inc. of Berwyn, Pa. with a suitable organic vehicle.

The organic vehicles are solutions of resin binders such as, for example, cellulose derivatives, particularly ethyl cellulose sold as ET-100 by Hercules, Inc., synthetic resins such as polyacrylates, polymethacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2,4-trimethyl-2,3-pentanediol monisobutyrate, available from Texas Eastman Company under the trademark Texanol and the like.

The above resin binders may be utilized individually or in any combination of two or more. A suitable viscosity modifier can be added to the resin material if desired. Such a modifier can be, for example, a castor oil derivative available from N.L. Industries under the trademark Thixatrol.

The vehicles also suitably contain a surfactant such as oleylamine, available as Armeen O, or a high molecular weight N-alkyl-1,3-diaminopropane dioleate, available as Duomeen TDO, both from AKZO Chemie America.

Regardless of the vehicle utilized, it is important that the homogeneity of the ink be maximized. Therefore, mixing is suitably carried out in a conventional apparatus which mixes in combination with subjecting the dispersion to high shearing action.

The inks can be printed on alumina substrates in known manner and fired in nitrogen at up to 900° C.

This invention will be further illustrated in the following Examples. In Examples, part are by weight and temperature is given in degrees Celsius.

EXAMPLE 1- Preparation of Zinc-Alumino-Silicate Glass

The following powders were mixed, melted to form a glass, quenched, and ground to a particle size of about 1–5 micrometers:

| Constituents | % |
|---|---|
| ZnO | 45.429 |
| $Al_2O_3$ | 11.385 |
| $SiO_2$ | 43.196 |

The devitrifying glass above has a temperature coefficient of linear expansion (in units of $10^{-7}$/° C.) that rose from a positive value of about 22 at room temperature to a maximum value of about 29 at about 125° C., then steadily fell (i.e., exhibited a negative slope) to a value of about 19 at about 500° C. From 500°–900° C., the temperature coefficient of linear expansion rose slightly to about 20.

EXAMPLE 2-Preparation of Copper Via Fill Ink

The glass prepared as in Example 1 was employed to make an ink by mixing the glass particles and copper powder in an organic vehicle as given below:

| Constituents | % |
|---|---|
| Copper powder | 62.8 |
| Glass powder | 24.9 |
| 6% ET-100 in Texanol | 6.2 |
| 10% Thixatrol in Texanol | 3.1 |
| Texanol | 2.8 |
| Duomeen TDO | 0.2 |

The ratio of copper to glass is 10:4

EXAMPLE 3 -Preparation of Cooper Via Fill Ink

An ink was prepared as in Example 2 having the following ingredients:

| Constituents | % |
|---|---|
| Copper powder | 57.1 |
| Glass powder | 28.5 |
| 6% ET-100 in Texanol | 8.6 |
| 10% Thixatrol in Texanol | 2.8 |
| Texanol | 2.8 |
| Duomeen TDO | 0.2 |

The ratio of copper to glass is 10:5

EXAMPLE 4-Preparation of Copper Via Fill Ink

An ink was prepared as in Example 2 having the following ingredients, wherein the organic vehicle contains the same mixture as in Examples 2 and 3.

| Constituents | % |
|---|---|
| Copper powder | 52.7 |
| Glass powder | 31.6 |
| Organic binder | 15.7 |

The ratio of copper to glass is 10:6

The inks were printed on alumina substrates and fired in nitrogen at a peak temperature of 900° C. A multilayer structure was formed by printing and firing alternate layers of a dielectric film adjacent to copper via posts made from the above copper inks.

Via integrity was observed in all cases.

Thus the thick-film copper inks incorporating the devitrifying glass frits having compositions in accordance with the present invention are suitable for forming via connections in copper-dielectric multilayer structures. Furthermore, the use of the thick-film copper inks formulated in accordance with the present invention are not limited to their desirable use as copper ink via fills on alumina substrates. They may also be used with advantage in the fabrication of a printed circuit on the surface of an alumina substrate.

It should be understood that the devitrifying glass compositions of the present invention are not limited to their use in a thick film copper ink employed in the fabrication of alumina-substrate printed circuits. Substrates made up of other materials which exhibit a temperature coefficient of linear expansion relatively close to that of alumina (i.e., the thick film ink and the substrate material have closely matched coefficients of linear expansion over the range of room temperature to 900° C.) are considered to be within the purview of the present invention, and the invention is only to be limited in view of the appended claims:

We claim:

1. A devitrifying glass frit having a devitrification temperature of 900° C. or less and an endotherm prior to devitrification consisting essentially of, on a weight basis:

a) from about 43 to 48 percent of zinc oxide (ZnO);

b) from about 10 to 13 percent of aluminum oxide ($Al_2O_3$); and c) from about 40 to 46 percent of silicon dioxide ($SiO_2$).

2. A copper ink for use in a multilayer printed circuit, said ink comprising:

a) a devitrifying glass frit of claim 1;

b) copper in a ratio of between about 10:3 and 10;6 by weight of said glass frit; and c) an organic vehicle.

3. An article comprising a substrate and a fired patterned copper layer of an ink of claim 2.

4. An article according to claim 3 wherein said substrate is alumina.

5. A multilayer article comprising alternate layers of a conductor and a patterned dielectric having openings therein on a substrate, said openings containing the ink of claim 2.

6. An article according to claim 5 wherein said substrate is alumina.

7. An article according to claim 5 wherein said conductor layer is patterned to form a printed circuit.

*8. A conductive metal ink for use in a multilayer printed circuit, said ink comprising:*

*a) a divitrifying glass frit comprising from about 43 to 48 percent of zinc oxide (ZnO), from about 10 to 13 percent of aluminum oxide ($Al_2O_3$) and from about 40 to 46 percent of silicon dioxide ($SiO_2$);*

*b) a conductive metal; and*

*c) an organic vehicle.*

*9. A conductive metal ink according to claim 8 wherein said conductive metal is in a ratio of between about 10:3 and 10:6 by weight of said glass frit.*

*10. An article comprising a substrate and a fired patterned conductive metal layer of an ink of claim 8.*

*11. An article according to claim 10 wherein said substrate is alumina.*

*12. A multilayer article comprising alternate layers of a conductor and a patterned dielectric having openings therein on a substrate, said openings containing the ink of claim 8.*

*13. An article according to claim 12 wherein said substrate is alumina.*

*14. An article according to claim 12 wherein said conductor layer is patterned to form a printed circuit.*

* * * * *